(12) United States Patent
Agrawal

(10) Patent No.: US 10,061,378 B2
(45) Date of Patent: Aug. 28, 2018

(54) SYSTEM AND METHOD FOR ADJUSTING DEVICE PERFORMANCE BASED ON SENSED HOST CURRENT SOURCING CAPABILITY

(71) Applicant: SanDisk Technologies LLC, Plano, TX (US)

(72) Inventor: Ankur Agrawal, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/223,773

(22) Filed: Jul. 29, 2016

(65) Prior Publication Data
US 2018/0032122 A1 Feb. 1, 2018

(51) Int. Cl.
| | |
|---|---|
| G06F 9/00 | (2006.01) |
| G06F 1/32 | (2006.01) |
| G06F 3/06 | (2006.01) |
| G06F 13/40 | (2006.01) |
| G06F 13/42 | (2006.01) |
| G06F 1/26 | (2006.01) |
| G11C 5/14 | (2006.01) |

(Continued)

(52) U.S. Cl.
CPC ............ *G06F 1/3287* (2013.01); *G06F 1/266* (2013.01); *G06F 1/3275* (2013.01); *G06F 3/0604* (2013.01); *G06F 3/0625* (2013.01); *G06F 3/0634* (2013.01); *G06F 3/0679* (2013.01); *G06F 13/4068* (2013.01); *G06F 13/4282* (2013.01); *G11C 5/148* (2013.01); *G11C 7/20* (2013.01); *G11C 16/30* (2013.01); *G11C 29/021* (2013.01); *G06F 2213/0042* (2013.01); *G11C 5/14* (2013.01); *G11C 7/24* (2013.01)

(58) Field of Classification Search
CPC .................................................... G06F 1/3287
USPC ............ 713/320, 300, 340; 361/10, 679.41; 711/103
See application file for complete search history.

(56) References Cited

U.S. PATENT DOCUMENTS

| | | | |
|---|---|---|---|
| 5,930,168 A | 7/1999 | Roohparvar | |
| 7,221,590 B2 | 5/2007 | Lee et al. | |

(Continued)

OTHER PUBLICATIONS

Search Report and Written Opinion for application No. PCT/US2017/031981 dated Jul. 12, 2017.

*Primary Examiner* — Aurel Prifti
(74) *Attorney, Agent, or Firm* — Brinks Gilson & Lione

(57) ABSTRACT

A system and method is disclosed for an electronic device, such as a non-volatile memory associated with a host, to determine a current sourcing capability of the host and to adjust performance characteristics of the electronic device based on the determined current sourcing capability. The system may include an input current source testing circuit, device function circuitry and a controller configured to determine a current sourcing capability of a host with the input current source testing circuit, select a device performance parameter associated with the determined current sourcing capability and operate the device function circuitry according to the device performance parameter until detecting a power-off event. The method may include the electronic device reducing a resistance presented to the host to a plurality of predetermined resistance levels to determine the current sourcing capability of the host and utilizing the results of the determination to select associated device performance parameters.

20 Claims, 6 Drawing Sheets

(51) Int. Cl.
   *G11C 7/20*   (2006.01)
   *G11C 16/30*  (2006.01)
   *G11C 29/02*  (2006.01)
   *G11C 7/24*    (2006.01)

(56) References Cited

U.S. PATENT DOCUMENTS

| | | | |
|---|---|---|---|
| 9,111,603 B1* | 8/2015 | Wang | G11C 5/147 |
| 9,886,080 B2* | 2/2018 | Suryaprakash | G06F 1/3296 |
| 2006/0062052 A1* | 3/2006 | Kumahara | G11C 16/30 |
| | | | 365/189.08 |
| 2010/0100752 A1* | 4/2010 | Chueh | G06F 1/3203 |
| | | | 713/320 |
| 2010/0185877 A1* | 7/2010 | Chueh | G06F 1/26 |
| | | | 713/300 |
| 2011/0022789 A1* | 1/2011 | Fujimoto | G06F 1/266 |
| | | | 711/103 |
| 2011/0231690 A1* | 9/2011 | Honda | G11C 5/147 |
| | | | 713/340 |
| 2013/0232349 A1* | 9/2013 | Oler | G06F 1/263 |
| | | | 713/300 |
| 2013/0322010 A1* | 12/2013 | Hung | G06F 13/4081 |
| | | | 361/679.41 |
| 2013/0339757 A1* | 12/2013 | Reddy | G06F 1/3212 |
| | | | 713/300 |
| 2015/0049402 A1* | 2/2015 | Fong | H02H 9/005 |
| | | | 361/10 |
| 2015/0089248 A1* | 3/2015 | Obie | G06F 1/266 |
| | | | 713/300 |
| 2015/0185797 A1 | 7/2015 | Cooper et al. | |

\* cited by examiner

SYSTEM AND METHOD FOR ADJUSTING DEVICE PERFORMANCE BASED ON SENSED HOST CURRENT SOURCING CAPABILITY

BACKGROUND

Computer systems, communication devices and other host systems often work with peripheral devices or removable devices to enhance the function of the host system. For example, storage systems, such as solid state drives (SSDs) including NAND flash memory, are commonly used in electronic systems ranging from consumer products to enterprise-level computer systems. Many consumers are familiar with the various types of portable USB or card format non-volatile memory systems. Innovations in capabilities of these storage devices may outpace the ability of manufacturers of hosts that utilize these storage systems to keep up. In order to provide basic functionality to a host, a storage device generally needs to be designed to work with a minimum specified power supply that a host is supposed to provide according to the applicable standard. There may be instances where a storage device or other peripheral may be able to provide a higher level of performance to a host, but only if the storage device can access resources, such as additional power, that a host is not required to provide according to a known standard or protocol.

DETAILED DESCRIPTION

Figure 1A:
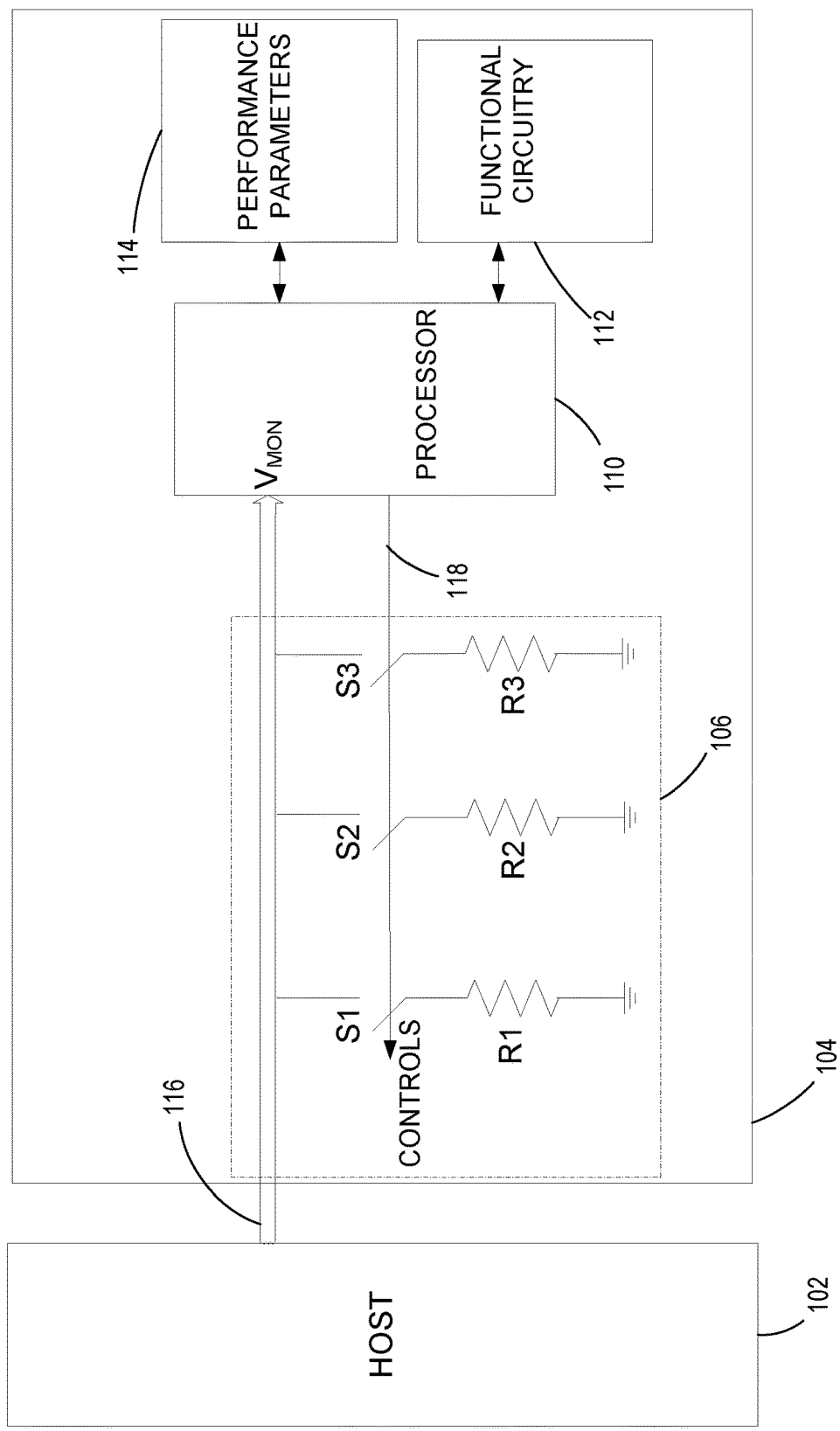
FIG. 1A is a block diagram of an example electronic device having host current source capability sensing circuitry.

A method and system are disclosed below for an electronic device, connectable with a host, to adjust its performance parameters to take advantage of additional detected current sourcing capabilities of the host beyond an expected default capability. The electronic device may include a current sourcing test circuit that is controllable to change a resistance presented by the electronic device to the host. The voltage supplied by the host to the electronic device may be measured at the changed resistance to gauge whether the host can support the greater current sourcing needs of the electronic device. Depending on the results of the determined current sourcing capability, the electronic device may then adjust its performance parameters accordingly. If the determined sourcing capability is not greater than the expected amount, then a default performance parameter may be utilized, and if a higher current sourcing capability of the host is detected, than a higher performance parameter may be selected to utilize the extra current and provide greater performance. The performance parameters may simply be a default and a single enhanced performance level, or there may be more than two levels of current sourcing capability that may be detected, each having a different associated set of one or more performance parameters exclusively associated with a particular detected current sourcing capability.

According to one aspect, a method is disclosed for adjusting device performance parameters for an electronic device. The method may include detecting a connection with a host and generating a busy indicator at the device identifiable by the host as representing that the device is in a busy state. The electronic device may then automatically determine a current sourcing capability of the host via the connection and select a device performance parameter from a plurality of device performance parameters based on the determined current sourcing capability.

According to another aspect of the invention, an electronic device removably attachable to a host is disclosed. The electronic device may include an input current source testing circuit, device function circuitry, and a controller in communication with the input current source testing circuit and the device function circuitry. The controller may be configured to, upon detection of an initial power-on voltage from the host, determine a current sourcing capability of the host at a plurality of current sourcing levels with the input current source testing circuit. The controller may be further configured to select a device performance parameter from a plurality of device performance parameters for the device function circuitry, where the selected device performance parameter is associated with the determined current sourcing capability. The controller may then cause the device function circuitry to operate according to the selected device performance parameter until detecting a power-off event.

In different implementations, the input current source testing circuit may have a plurality of processor selectable resistance paths arranged for individual selection of only one of the plurality of resistance paths at any one time, where each of the plurality of resistance paths is a different resistance than each other of the resistance paths. The processor selectable resistance paths may each include a resistor. To test the current sourcing capability of the host, the controller in the electronic device may be configured to alter an input resistance presented to the host via the input current source testing circuit until an input voltage from the host falls below a predetermined threshold. In one implementation, the electronic device may be a non-volatile memory system, and the device function circuitry may be a plurality of non-volatile memory die.

In yet another implementation, an electronic device is disclosed that is removably attachable to a host via a host connection. The electronic device may include device function circuitry and means for determining a current sourcing capability of the host via the connection. The electronic device may further include means for selecting a device performance parameter from a plurality of device performance parameters based on the determined current sourcing capability and for operating the device function circuitry according to the selected device performance parameter.

FIG. 1A is a block diagram illustrating a host 102 connected with an electronic device 104. The host may be a computer, mobile phone, tablet, or any of a number of known devices that may connect with, and supply power to, other electronic devices, such as peripheral devices. The electronic device 104 is illustrated as connected to the host via a voltage supply line 116. In one implementation, the voltage supply line 116 is representative of the supply line that may be created by connector portions on each of the host 102 and electronic device 104, for example a universal serial bus (USB) connection, that cooperate to allow electronic devices to be removably connected with hosts. Any of a number of other complementary connector types may be utilized in different embodiments.

The electronic device may include a host current sourcing test circuit 106 made up of resistive elements, such as resistors R1, R2 and R3 that are connectable between the voltage supply line 116 and ground via respective switches S1, S2 and S3. The electronic device 104 may include a processor 110, functional circuitry 112 for manipulating data accessible by the host and a memory having performance parameters 114 that govern the performance settings of the functional circuitry and/or the processor 110. The host current sourcing test circuit 106 shown in FIG. 1A may be controlled by the processor 110 to present a different resistance to the host 102 than a default resistance of the electronic device via the three independently controllable resistors R1, R2, R3. As described in greater detail below, the resistors R1, R2, and R3 may be connected separately, or in parallel, to reduce the resistance presented to the host over the voltage supply line 116. Resistors R1, R2, and R3 may be connected or disconnected to the voltage supply line by switches S1, S2 and S3 controlled over control line 118 by the processor 110. The various illustrated components of the electronic device 104 may part of a single integrated circuit, or may be discrete elements.

Figure 1B:
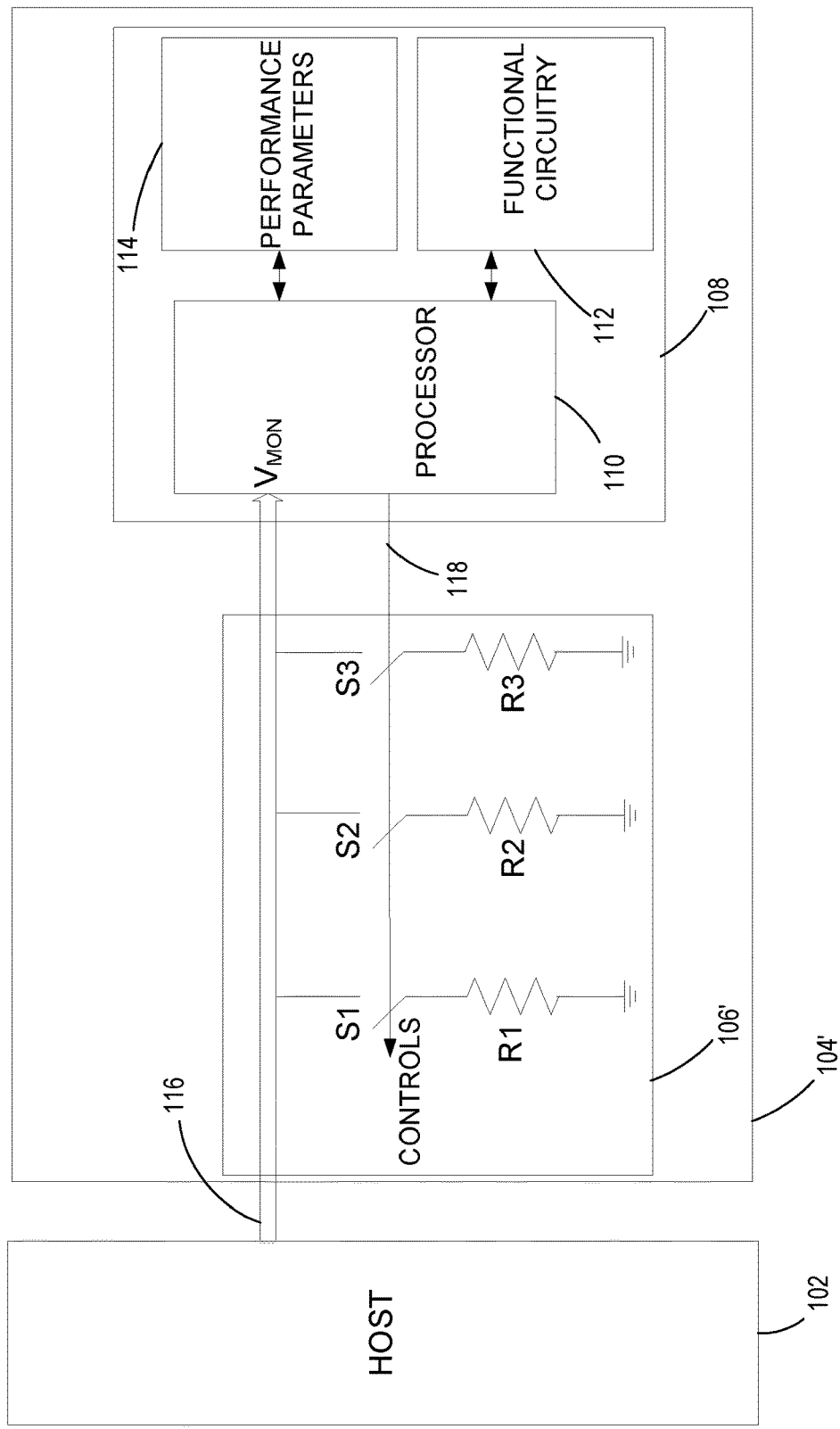
FIG. 1B is a block diagram of an alternative embodiment of the electronic device of FIG. 1A.

Referring to FIG. 1B, an alternative implementation of the electronic device 104' is shown where the host current sourcing test circuit 106' is a discrete integrated circuit, for example a separate integrated circuit die. The processor 110, functional circuitry 112 and memory having performance parameters 114 are all formed on a separate integrated circuit 108 that may be a stand-alone die packaged with the current sourcing test circuit 106'. Other variations of integrated or discrete portions of the overall electronic device 104 illustrated in FIG. 1A are also contemplated. Additionally the host current source testing circuit 106, 106' may be any of a number of other circuit configurations, have fewer or greater number of resistive paths, and may even be integrated into the processor circuitry on a single application specific integrated circuit (ASIC). The resistors R1, R2, R3 may be combined into a single electronically adjustable resistor, or be multiple electronically adjustable resistances to provide even finer granularity resistance changes in other implementations.

Figure 2:
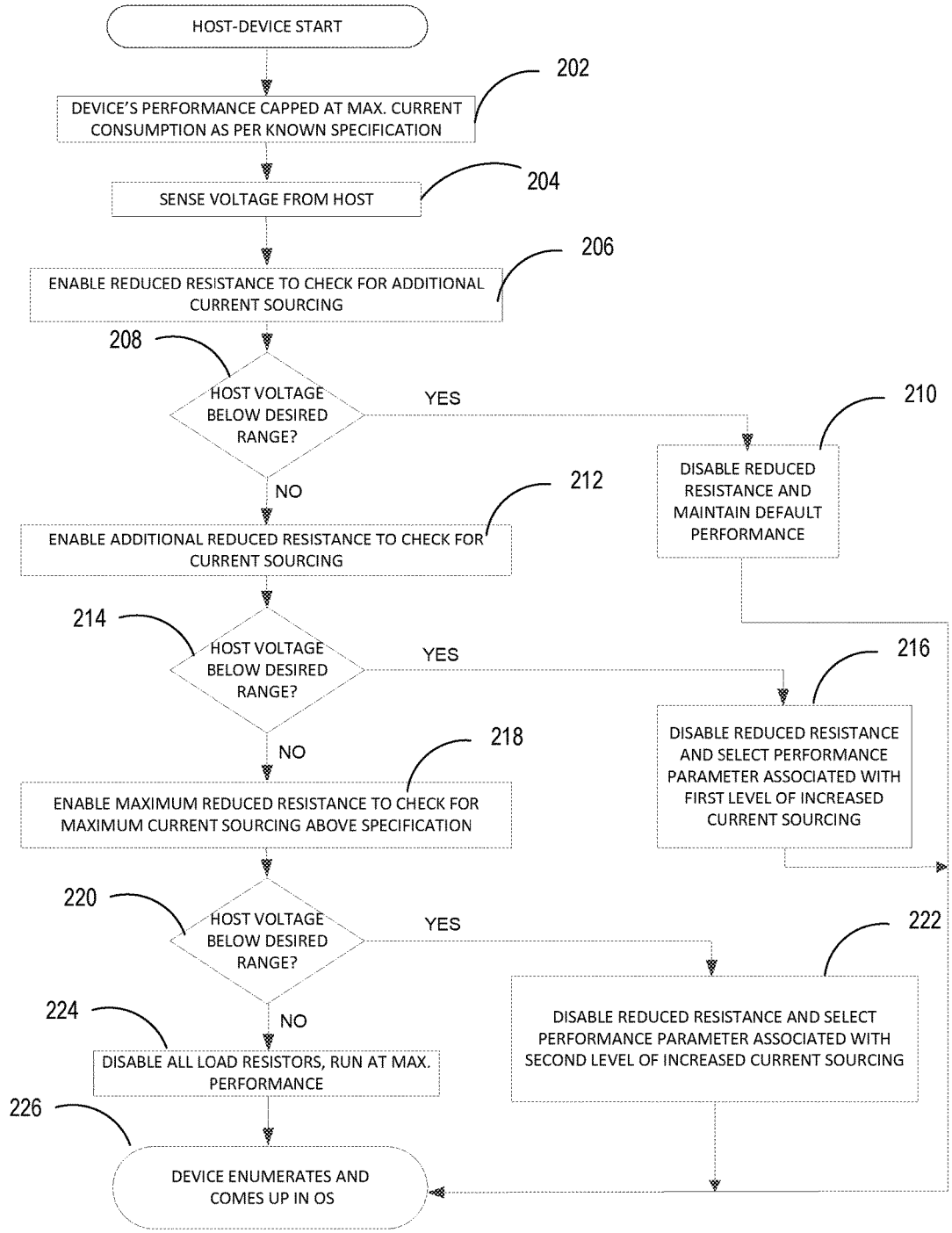
FIG. 2 is a flow diagram illustrating an embodiment of a method of adjusting performance parameters of an electronic device such as shown in FIGS. 1A and 1B based on a determined host current sourcing capability.

Referring now to FIG. 2, a method of utilizing an electronic device 104, 104' with a testing circuit 106, 106' such as shown in FIGS. 1A-1B is shown. At power up of the electronic device 104, when the electronic device is first connected to the host 102 and the host provides initial power up voltage and current, the device is in an idle state such that no host commands are pending. In some implementations, the electronic device may set a busy indicator internally that the host may access to recognize that the device is not ready for receiving host commands. The busy indicator may be a flag, a message, or a voltage that the electronic device 104 generates and either provides for sensing by the host 102 or transmits to the host 102 so that host remains in an idle state where no commands are sent to the device.

The processor 110 may then start its initialization process when the voltage supply has stabilized from the host, assuming the host is configured to only provide the specified amount of current and voltage associated with a known default specification. The processor of the electronic device will make sure to limit its performance level to draw no more than the predetermined specified current from the host and then verify the voltage level that the host maintains over the voltage channel 116 (at 202, 204). For example, if the electronic device is a USB 3.0 device, then, in conformance with the expected default host sourcing capabilities of this protocol, the processor at power-up will draw no more than the 900 milliampere (mA) current from the host and the processor will sense the voltage from the host.

Once the baseline host voltage is measured for the specified current sourcing, which should be 5 volts at 900 mA assuming the USB 3.0 example, the processor may reduce the resistance presented to the host (at 206). For example, the processor may engage S1 to enable R1, which is a resistance set to draw more current at the baseline voltage than the specified 900 mA. In this example, assuming that the baseline voltage is 5 volts, then if R1 is a 5 Ohm resistor, the current should be closer to 1000 mA if the host is able to provide current beyond the 900 mA specification. Once R1 is enabled, the processor then measures the host voltage being supplied to see if it dipped below a predetermined acceptable level (at 208). The predetermined level may be up to a 5 percent drop in voltage, or 4.75 volts in this example. If the voltage measured after enabling R1 is less than the acceptable predetermined level, here less than 4.75 volts, then the processor may automatically disable R1 by opening S1 and revert to maintaining the performance level of the electronic device at the default performance level because the host cannot source sufficient current at the desired voltage level (at 210). The electronic device would then finish its enumeration with the host and be recognized by the operating system (OS) such that a user could access or view the electronic device in the host. In one implementation, if the electronic device was a memory device, the OS would then recognize the device and provide it a drive letter (at 226).

If, however, the host voltage measured after enabling R1 is still within the predetermined range of the baseline voltage (e.g. within 5% of the baseline voltage, or 4.75 v-5.0 v here), then the processor may continue testing the limits of the current sourcing capabilities of the host (at 208). In this instance, the processor would introduce a further resistance reduction (at 212). In this example, the processor may engage both switches S1 and S2 to enable R2 in parallel with R1. The lowered resistance of R1 in parallel with R2 may be 4.6 ohms in this example (where R1=5 ohms and R2=57.5 ohms). If the monitored host voltage subsequently drops more than the predetermined amount (5 percent in this example), then the processor disables R1 and R2 and selects performance parameters 114 for the electronic device 104 that correspond to a host current sourcing ability greater than the specified 900 mA, but less than the 1.086 amps that the R1 and R2 parallel setting was seeking (at 216, 226). Alternatively, if the monitored host voltage stayed within the predetermined voltage range of 5% of the baseline level, then the testing of current sourcing capability may continue for another round and the processor may engage the lowest current sourcing detection resistance to see if the maximum amount of current is available that would allow the electronic device to maximize performance of the functional circuitry (at 218). In the electronic device example of FIGS. 1A and 1B, the processor 110 would test for this maximum possible current sourcing by switching switches S3, S2 and S1 to enable resistors R3, R2 and R1 to operate in parallel. Assuming the desired resistance of the three resistors in parallel is 4.5 ohms (Where R3 is approximately 207 ohms)

a current of approximately 1.111 amps may be tested for. Again, the voltage from the host may be subsequently measured and, if still within the 5% desired range, the processor may then retrieve and implement the performance parameters associated with that highest host current sourcing capability (at 224), otherwise the processor would retrieve and implement the performance parameters for the last current sourcing level where the host maintained the desired voltage, in this example the performance level that uses the possible 1.086 amp current sourcing (at 222, 226).

After going through the various levels of current sourcing tests, the electronic device 104 may fully enumerate to operate at the performance level commensurate with the performance parameters that match the tested current sourcing capability of the host (at 226). This performance parameter setting may be maintained, without further current sourcing testing or adjustment, until a next power-on sequence is detected by the processor for the electronic device. In one implementation, the electronic device 104 may change the busy indicator for the device, to indicate to the host 102 that it is no longer busy after determining the host current sourcing capability and setting the performance parameter(s), and allow the host 102 to complete its initialization process, recognize the electronic device and send commands to the electronic device.

For purposes of illustration only, the above example host current sourcing detection included 3 discrete testing levels for current sourcing (a first, a second and a maximum level). This amount may be as few as two different levels or as many testing levels as desired. It is contemplated that the testing levels may be set to the levels at which the electronic device can add a particular new function or new level of functionality with the added current sourcing being tested for. Also, the USB 3.0 specification of 5 volt and 900 mA default standards is provided by way of example only. Any other specification (also referred to herein as protocol), along with its default current and voltage specifications, may be utilized in different implementations. Additionally, the specific 5% ranges mentioned above may be adjusted to tighter or wider voltage ranges in different implementations, and the ranges may change at different host current sourcing test levels, for example the acceptable voltage range may be 5% at the first resistance level, but less than 5% at lower resistance levels (i.e., at higher host current sourcing levels).

In one implementation, the process of measuring host current sourcing capability described above may include the processor 110 of the electronic device 104 measuring the default voltage provided when the electronic device is initially configured at the default performance level, in other words configured to draw no more than the current specified by the specifications of the default standard or protocol (e.g. USB 2.0, USB 3.0 or other industry default standards having specific minimum current sourcing requirements). The actual sensed voltage provided by a particular host 102 may be, for example, 4.8 volts rather than the expected 5.0 volts. The processor 110 may use this actual sensed voltage as the baseline from which the 5 percent acceptable range is calculated, rather than a fixed voltage range from an expected voltage.

Figure 3:
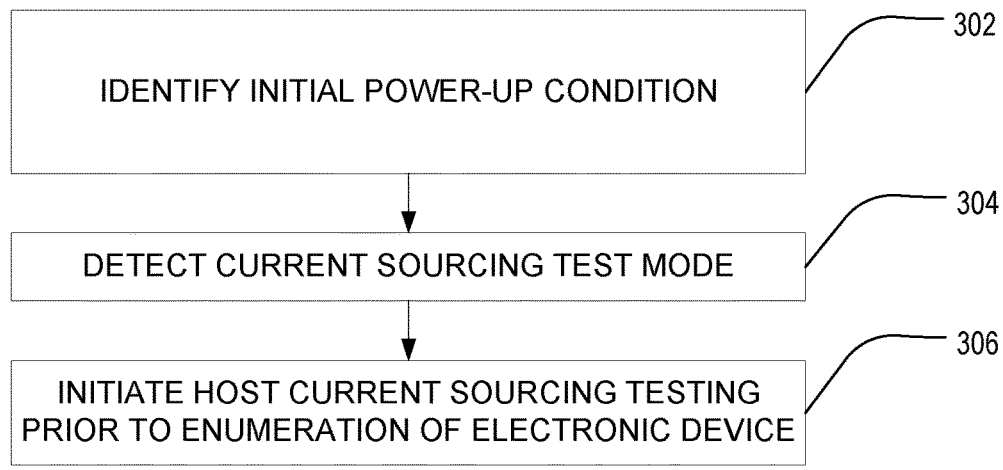
FIG. 3 is a flow diagram of a method of initiating a host current sourcing capability test such as disclosed in FIG. 2.

In one implementation, the testing for host current sourcing capability may be automatic every time the electronic device detects a power-up operation. In other embodiments, the testing of host current source capabilities may be optional. Referring to FIG. 3, the electronic device may, prior to engaging in the current source capability testing of FIG. 2, first identify an initial power-up condition where sufficient power from the host is received (when the host is initially turned on or the electronic device is first connected to a host that is already powered on) (at 302). The processor 110 of the electronic device 104 may then check to see if a current source test is desired (at 304) and then initiate the testing of current sourcing capabilities of the host 102 prior to completing the enumeration (full power on initialization) of the electronic device 104 (at 306). The detection of the current sourcing test mode may be as basic as looking at a mode switch setting on the electronic device, or may be part of a user query and response via a user interface upon startup. For example, the electronic device 104 may be configured with a mode switch that a user can physically access from the outside housing of the electronic device to select between a current source testing mode such as described in FIG. 2, or a non-testing mode where the electronic device 104 will only operate at a default performance level, relying on the industry specified current sourcing for the particular standard, and will not engage in testing for possible additional current sourcing capabilities. In yet other implementations, the current source capability of the host 102 may be selected by a user via a user interface when the electronic device 104 is initially powered up. In this latter implementation, the processor 110 of the electronic device 104 may transmit user interface information to cause the host 102 to display a current sourcing test query to the user on initial power up, but before the electronic device has finished the power up process, where the user can respond yes or no to the testing via the interface generated.

Figure 4:
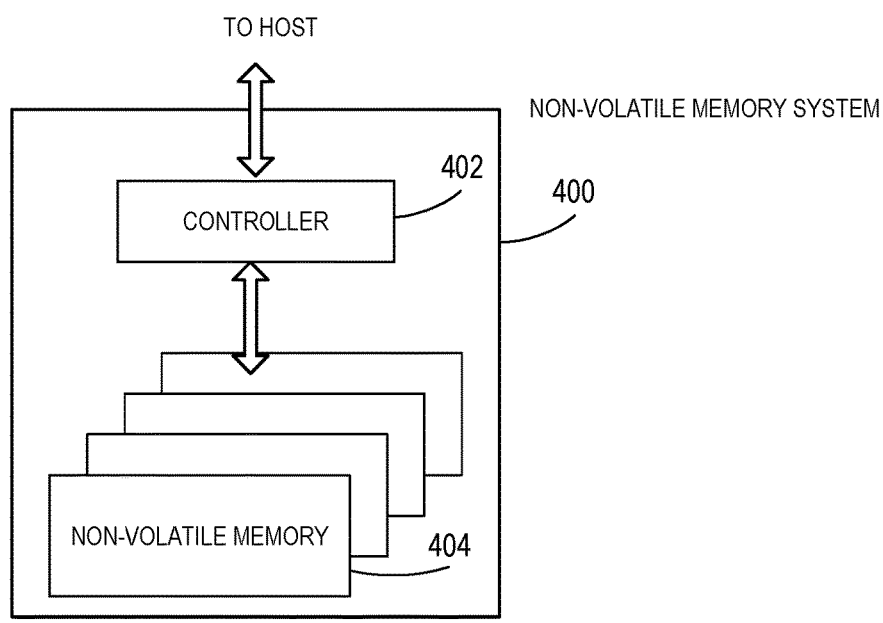
FIG. 4 is a block diagram of an example nonvolatile memory system that may be used as the electronic device of FIGS. 1A and 1B.

The electronic device 104 disclosed above, may be any of a number of known devices that can be attached to a host and receives it power from the host connection. In one implementation, the electronic device 104 may be a memory system, such as a non-volatile memory, where the functional circuitry may be non-volatile memory die, such as flash memory die and the processor may be a controller for the non-volatile memory. FIG. 4 is a block diagram illustrating a non-volatile memory system. The non-volatile memory (NVM) system 400 includes a controller 402 and non-volatile memory that may be made up of one or more non-volatile memory die 404. As used herein, the term die refers to the set of non-volatile memory cells, and associated circuitry for managing the physical operation of those non-volatile memory cells, that are formed on a single semiconductor substrate. Controller 402 interfaces with a host system and transmits command sequences for read, program, and erase operations to non-volatile memory die 404.

The controller 402 (which may be a flash memory controller) can take the form of processing circuitry, one or more microprocessors or processors (also referred to herein as central processing units (CPUs)), and a computer-readable medium that stores computer-readable program code (e.g., software or firmware) executable by the (micro)processors, logic gates, switches, an application specific integrated circuit (ASIC), a programmable logic controller, and an embedded microcontroller, for example. The controller 402 can be configured with hardware and/or firmware to perform the various functions described below and shown in the flow diagrams. Also, some of the components shown as being internal to the controller 402 can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 404 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 402 and non-volatile memory die 404 may be any suitable flash interface, such as Toggle Mode 200, 400, or 800. In one embodiment, NVM memory system 400 may be a card based system, such as a secure digital (SD) or a micro secure digital (micro-SD) card. In an alternate embodiment, memory system 100 may be part of an embedded memory system.

Although in the example illustrated in FIG. 4 the NVM system 400 includes a single channel between controller 402 and non-volatile memory die 404, the subject matter described herein is not limited to having a single memory channel. For example, in some NAND memory system architectures 2, 4, 8 or more NAND channels may exist between the controller and the NAND memory device, depending on controller capabilities. More than a single channel may exist between the controller and the memory die, even if a single channel is shown in the drawings.

Figure 5A:
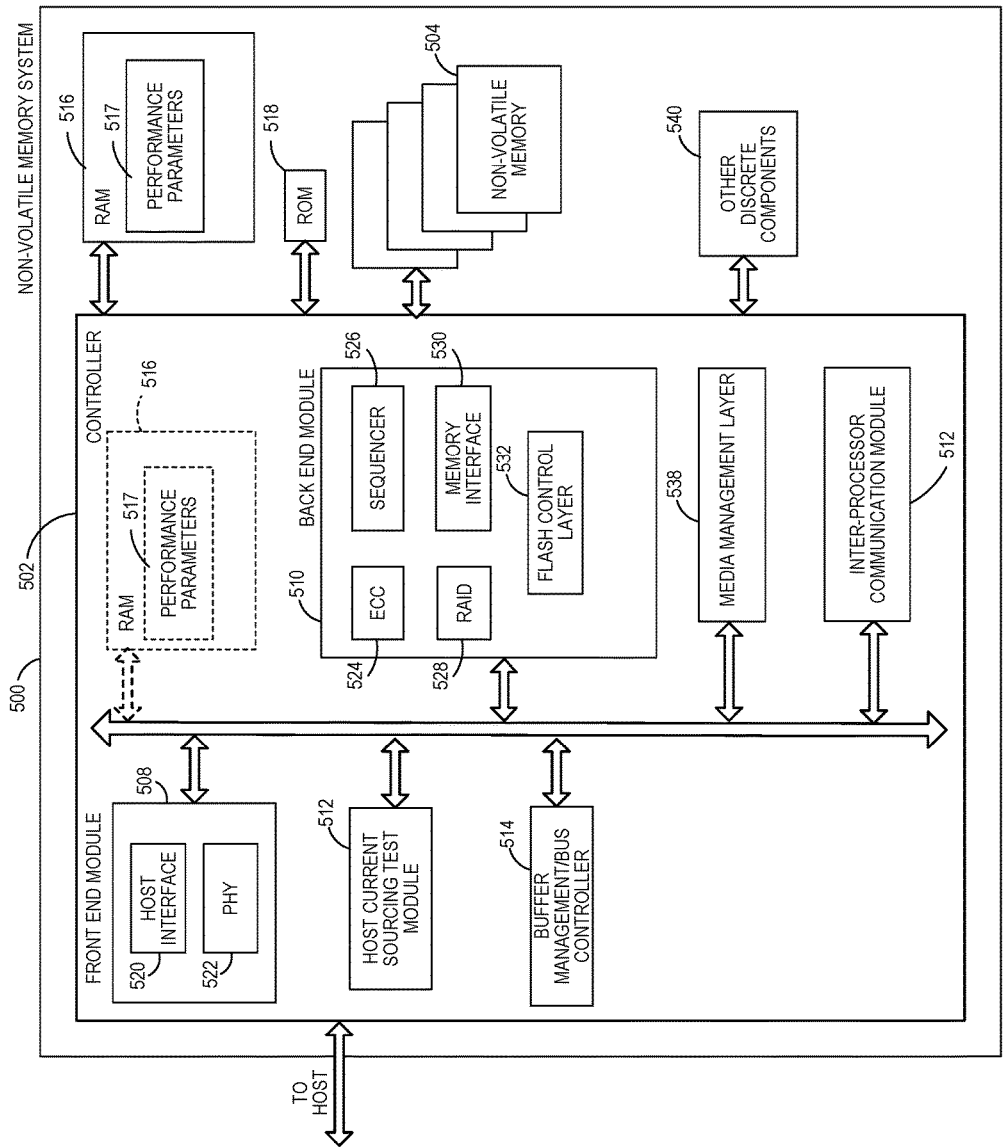
FIG. 5A is a block diagram illustrating exemplary components of a controller of a non-volatile memory system.

FIG. 5A is a block diagram illustrating exemplary components of controller 502, corresponding to controller 402 of FIG. 4, in more detail. Controller 502 includes a front end module 508 that interfaces with a host, a back end module 510 that interfaces with the one or more non-volatile memory die 504, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Modules of the controller 502 may include host current sourcing test module 512 present on the die of the controller 502. The host current sourcing test module 512 may provide functionality for managing the use fast erasure procedures to prevent unauthorized access of data. A buffer manager/bus controller 514 manages buffers in random access memory (RAM) 516 and controls the internal bus arbitration of controller 502. A read only memory (ROM) 518 stores system boot code. Although illustrated in FIG. 5A as located separately from the controller 502, in other embodiments one or both of the RAM 516 and ROM 518 may be located within the controller 502. In yet other embodiments, portions of RAM 516 and ROM 518 may be located both within the controller 502 and outside the controller. Further, in some implementations, the controller 502, RAM 516, and ROM 518 may be located on separate semiconductor die. As described in greater detail below, the RAM 516 in the NVM system, whether outside the controller 502, inside the controller or present both outside and inside the controller 502, may contain a number of items, including a copy of all or part of the logical-to-physical mapping tables for the NVM system 500. Also, the RAM 516 may contain a copy of the performance parameters 517 that the controller 502 may select from based on the determined host current sourcing capabilities as discussed above with respect to FIGS. 1A-1B and 2.

A separate copy of the performance parameters 517 may be kept in the non-volatile memory 504. Although the performance parameters may be directed to any of a number of features of the NVM system 500, in one implementation, the performance parameters may be instructions to operate different numbers of the non-volatile memory die at different host current source levels. For example, the number of non-volatile memory die 504 included in the NVM system 500 may be eight and the default performance parameter for hosts only capable of sourcing the specified amount of current for a particular protocol (e.g. USB 3.0) may include instructions to only operate 4 of the die 504 at any one time, while the performance parameter 517 associated with a detected higher host current sourcing capability may be instructions to concurrently operate a greater number of die 504 concurrently to provide greater performance.

The performance parameters may include more than one additional feature or type of feature made operational at each different predetermined current sourcing level. For example, other performance parameters that may be alternatively or additionally adjusted based on the determined current sourcing ability of the host may include processor speed of the processor in the controller, the toggle mode frequency to the NAND interface, and the number of non-volatile memory die interleaved in a write operation. The processor speed, where increased processor speed requires greater current sourcing, may be increased from a default speed in one or more increments correlated to one or more different host current sourcing levels being tested for based on the determined host current sourcing capability. Similarly, the number of NAND die being interleaved may be increased from a default number to a greater number based on the determined current sourcing capability of the host. In different implementations, any of these or other performance parameters for the NVM system 500 may be increased, alone or in any combination to take advantage of any additional current sourcing capabilities of a host beyond the default current sourcing specified for a host using a particular protocol. Also, although the performance parameters listed above relate to a device that is a NVM memory system, the same or different performance parameters may be used in other electronic devices, where additional host current sourcing capabilities beyond a default expected current sourcing for an expected specification or protocol may be used by the electronic device.

Front end module 508 includes a host interface 520 and a physical layer interface (PHY) 522 that provide the electrical interface with the host or next level storage controller. The choice of the type of host interface 520 can depend on the type of memory being used. Examples of host interfaces 520 include, but are not limited to, SATA, SATA Express, SAS, Fibre Channel, USB, PCIe, and NVMe. The host interface 520 typically facilitates transfer for data, control signals, and timing signals.

Back end module 510 includes an error correction controller (ECC) engine 524 that encodes the data bytes received from the host, and decodes and error corrects the data bytes read from the non-volatile memory. A command sequencer 526 generates command sequences, such as program and erase command sequences, to be transmitted to non-volatile memory die 504. A RAID (Redundant Array of Independent Drives) module 528 manages generation of RAID parity and recovery of failed data. The RAID parity may be used as an additional level of integrity protection for the data being written into the NVM system 500. In some cases, the RAID module 528 may be a part of the ECC engine 524. A memory interface 530 provides the command sequences to non-volatile memory die 504 and receives status information from non-volatile memory die 504. In one embodiment, memory interface 530 may be a double data rate (DDR) interface, such as a Toggle Mode 200, 400, or 800 interface. A flash control layer 532 controls the overall operation of back end module 510.

Additional components of NVM system 500 illustrated in FIG. 5A include the media management layer 538, which performs wear leveling of memory cells of non-volatile memory die 504 and manages mapping tables and logical-to-physical mapping or reading tasks. NVM system 500 also includes other discrete components 540, such as external electrical interfaces, external RAM, resistors, capacitors, or other components that may interface with controller 502. In alternative embodiments, one or more of the physical layer interface 522, RAID module 528, media management layer 538 and buffer management/bus controller 514 are optional components that are not necessary in the controller 502.

Figure 5B:
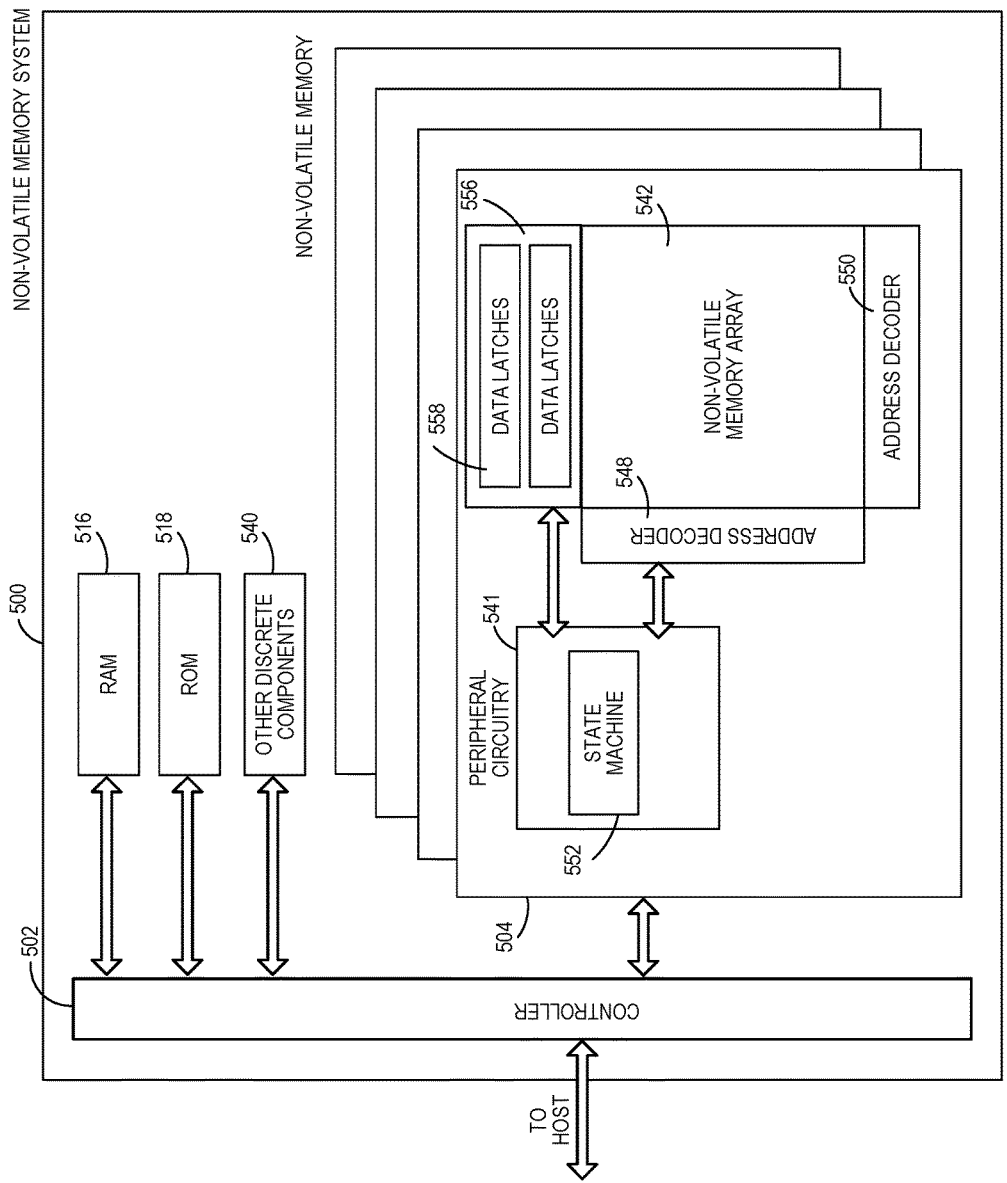
FIG. 5B is a block diagram illustrating exemplary components of a non-volatile memory of the non-volatile memory storage system of FIG. 5A.

FIG. 5B is a block diagram illustrating exemplary components of non-volatile memory die 504 in more detail. Non-volatile memory die 504 includes peripheral circuitry 541 and non-volatile memory array 542 with address decoders 548, 550. Non-volatile memory array 542 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 541 includes a state machine 552 that provides status information to controller 502. Non-volatile memory die 504 further includes a data cache 556 that caches data being read from or programmed into the non-volatile memory cells of the non-volatile memory array 542. The data cache 556 comprises sets of data latches 558 for each bit of data in a memory page of the non-volatile memory array 542. Thus, each set of data latches 558 may be a page in width and a plurality of sets of data latches 558 may be included in the data cache 556. For example, for a non-volatile memory array 542 arranged to store n bits per page, each set of data latches 558 may include N data latches where each data latch can store 1 bit of data.

In one implementation, an individual data latch may be a circuit that has two stable states and can store 1 bit of data, such as a set/reset, or SR, latch constructed from NAND gates. The data latches 558 may function as a type of volatile memory that only retains data while powered on. Any of a number of known types of data latch circuits may be used for the data latches in each set of data latches 558. Each non-volatile memory die 504 may have its own sets of data latches 558 and a non-volatile memory array 542. Peripheral circuitry 541 includes a state machine 552 that provides status information to controller 502. Peripheral circuitry 541 may also include additional input/output circuitry that may be used by the controller 502 to transfer data to and from the latches 558, as well as an array of sense modules operating in parallel to sense the current in each non-volatile memory cell of a page of memory cells in the non-volatile memory array 542. Each sense module may include a sense amplifier to detect whether a conduction current of a memory cell in communication with a respective sense module is above or below a reference level.

The non-volatile flash memory array 542 in the non-volatile memory 504 may be arranged in blocks of memory cells. A block of memory cells is the unit of erase, i.e., the smallest number of memory cells that are physically erasable together. For increased parallelism, however, the blocks may be operated in larger metablock units. One block from each of at least two planes of memory cells may be logically linked together to form a metablock.

In the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

Methods and systems have been disclosed for testing a current sourcing capacity of a host to allow an electronic device, such as a non-volatile memory system, to adjust its performance parameters based on whether more than a standard amount of current can be accessed from the host. Electronic devices that include extra functionality and/or higher performance operating modes, but that cannot reliably operate in the higher performance mode without sufficient current, can adjust their performance to ensure stable operation when only a minimum current sourcing capability is detected, or reliably implement higher performance features if the host can provide that higher current associated with the higher performance needs. The testing may be performed by the electronic device on the host prior to fully completing the enumeration process where the device is fully recognized by the host and available for use. During this time, while the electronic device is idle, the electronic device may adjust the resistance it presents to the host to see if the host can source a greater amount of current than a predetermined specification, while maintaining a supply voltage to the electronic device that is within a predetermined acceptable range.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

I claim:

1. A method for adjusting device performance parameters for a device, the method comprising the device:
   detecting a connection with a host;
   generating a busy indicator at the device identifiable by the host as representing that the device is in a busy state;

determining a current sourcing capability of the host via the connection, wherein determining the current sourcing capability comprises changing a resistance at the device presented to the host over the connection from a default resistance and subsequently measuring a voltage supply level from the host; and selecting a device performance parameter from a plurality of device performance parameters based on the determined current sourcing capability.

2. The method of claim 1, wherein detecting the connection comprises detecting a predetermined initial power-up voltage from the host.

3. The method of claim 2, wherein generating the busy indicator comprises transmitting the busy indicator to the host over the connection.

4. The method of claim 1, wherein changing the resistance comprises:
switching the resistance from the default resistance to a first resistance lower than the default resistance; and
wherein when the subsequently measured voltage supply remains within a predetermined voltage range, the device selects a higher current consumption device performance parameter.

5. The method of claim 4, wherein the device is a memory system and the higher current consumption device performance parameter comprises an increased number of concurrently active non-volatile memory die over a default number of concurrently active non-volatile memory die.

6. The method of claim 1, further comprising maintaining the selected device performance parameter until a power-off event is detected.

7. An electronic device removably attachable to a host, the electronic device comprising:
an input current source testing circuit comprising a plurality of selectable resistance paths;
device function circuitry; and
a controller in communication with the input current source testing circuit and the device function circuitry, the controller configured to:
upon detection of an initial power-on voltage from the host, determine a current sourcing capability of the host at a plurality of current sourcing levels by changing a selection of at least one of the plurality of selectable resistance paths of the input current source testing circuit and subsequently measuring a voltage supply level from the host;
select a device performance parameter for the device function circuitry associated with the determined current sourcing capability from a plurality of device performance parameters; and
operate the device function circuitry according to the device performance parameter until detecting a power-off event.

8. The electronic device of claim 7, wherein the plurality of selectable resistance paths are arranged for individual selection of only one of the plurality of selectable resistance paths at any one time, wherein each of the plurality of selectable resistance paths is a different resistance than each other of the selectable resistance paths.

9. The electronic device of claim 7, wherein the plurality of selectable resistance paths are arranged for selection of one of the plurality of selectable resistance paths or selection of multiple ones of the plurality of selectable resistance paths in parallel at any one time.

10. The electronic device of claim 7, wherein each of the plurality of selectable resistance paths comprise a resistor.

11. The electronic device of claim 7, wherein to determine the current sourcing capability of the host at the plurality of current sourcing levels, the controller is configured to alter an input resistance presented to the host via the input current source testing circuit until an input voltage from the host falls below a predetermined threshold.

12. The electronic device of claim 11, wherein the electronic device comprises a non-volatile memory system.

13. The electronic device of claim 11, wherein the controller is configured to alter the input resistance by reducing the input resistance presented to the host via the input current source testing circuit.

14. The electronic device of claim 7, wherein the electronic device comprises a non-volatile memory system, and the device function circuitry comprises a plurality of non-volatile memory die.

15. The electronic device of claim 14, wherein the device performance parameter comprises a number of concurrently active non-volatile memory die of the plurality of non-volatile memory die.

16. The electronic device of claim 14, wherein at least one of the plurality of non-volatile memory die comprises a silicon substrate and a plurality of memory cells forming a monolithic three-dimensional structure, wherein at least one portion of the memory cells is vertically disposed with respect to the silicon substrate.

17. The electronic device of claim 7, wherein to determine the current sourcing capability of the host, the controller is further configured to:
when, after changing the selection of the plurality of selectable resistance paths to a selectable resistance path that is lower, the measured voltage supply level from the host is within a predetermined range, select a device performance parameter for the device function circuitry associated with a higher host current sourcing ability than a predetermined default host current sourcing ability.

18. The electronic device of claim 17, wherein:
the electronic device comprises a non-volatile memory system, and the device function circuitry comprises a plurality of non-volatile memory die; and
wherein the device performance parameter for the device function circuitry associated with the higher host current sourcing ability comprises a higher number of concurrently active non-volatile memory die than a predetermined default number of concurrently active non-volatile memory die.

19. An electronic device removably attachable to a host via a host connection, the electronic device comprising:
non-volatile data storage circuitry; and
means for determining a current sourcing capability of the host via the electronic device changing a resistance presented to the host over the host connection; and
means for selecting a non-volatile data storage circuitry performance parameter from a plurality of performance parameters based on the determined current sourcing capability and for operating the non-volatile data storage circuitry according to the selected non-volatile data storage circuitry performance parameter.

20. The electronic device of claim 19, wherein the non-volatile data storage circuitry comprises a plurality of non-volatile memory die.

* * * * *